(12) United States Patent
Son et al.

(10) Patent No.: US 12,232,287 B2
(45) Date of Patent: Feb. 18, 2025

(54) ELECTRONIC DEVICE INCLUDING HOUSING

(71) Applicant: SAMSUNG ELECTRONICS CO., LTD., Suwon-si (KR)

(72) Inventors: Kidoc Son, Suwon-si (KR); Youngchun Kim, Suwon-si (KR); Byounggyu Park, Suwon-si (KR); Kyunghwan Song, Suwon-si (KR); Hyuckki Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 300 days.

(21) Appl. No.: 17/682,158

(22) Filed: Feb. 28, 2022

(65) Prior Publication Data

US 2022/0408582 A1  Dec. 22, 2022

Related U.S. Application Data

(63) Continuation of application No. PCT/KR2022/002108, filed on Feb. 11, 2022.

(30) Foreign Application Priority Data

Jun. 22, 2021  (KR) .................. 10-2021-0080906

(51) Int. Cl.
*H05K 5/00*  (2006.01)
*B23H 3/00*  (2006.01)
(Continued)

(52) U.S. Cl.
CPC ................. *H05K 5/04* (2013.01); *B23H 3/00* (2013.01); *C25D 11/26* (2013.01); *C25D 11/34* (2013.01); *G06F 1/1613* (2013.01)

(58) Field of Classification Search
CPC ............................. H05K 5/04; G06F 1/1613
(Continued)

(56) References Cited

U.S. PATENT DOCUMENTS 9,983,622 B2 *  5/2018  Huang ................. C25D 11/026
10,842,035 B1  11/2020  Curran et al.
(Continued)

FOREIGN PATENT DOCUMENTS

CN  102480533  5/2012
CN  109561607  4/2019
(Continued)

OTHER PUBLICATIONS

Search Report and Written Opinion issued May 19, 2022 in counterpart International Patent Application No. PCT/KR2022/002108.
(Continued)

*Primary Examiner* — Zhengfu J Feng
(74) *Attorney, Agent, or Firm* — Nixon & Vanderhye P.C.

(57) ABSTRACT

According to various embodiments of the disclosure, an electronic device may include: a housing, a processor disposed inside the housing, the housing may include a metal member comprising a metal and including a first convex and concave pattern formed in a shape corresponding to a shape of a second convex and concave pattern formed on a jig, wherein the jig is formed for use in electro chemical machining (ECM), and the first convex and concave pattern may have at least a portion formed at a substantially uniform pitch and a substantially uniform height.

12 Claims, 13 Drawing Sheets

(51) Int. Cl.
   *C25D 11/26*   (2006.01)
   *C25D 11/34*   (2006.01)
   *G06F 1/16*    (2006.01)
   *H05K 5/04*    (2006.01)

(58) Field of Classification Search
   USPC .................................................. 361/679.01
   See application file for complete search history.

(56) References Cited

U.S. PATENT DOCUMENTS

2002/0134683 A1    9/2002   Steele
   2010/0005662 A1*   1/2010   Kim .................. F16C 17/026
                                                    29/898.02
   2011/0214993 A1    9/2011   Akana et al.
   2016/0255735 A1*   9/2016   Han ................... G06F 1/1626
                                                    359/894
   2017/0013735 A1    1/2017   Choi et al.
   2017/0253986 A1    9/2017   Akana et al.
   2017/0283974 A1   10/2017   Kim et al.
   2018/0073159 A1    3/2018   Curran et al.
   2019/0071764 A1*   3/2019   Oh ........................ H05K 5/03
   2020/0152875 A1    5/2020   Kim et al.
   2022/0006479 A1    1/2022   Chun et al.
   2023/0262912 A1*   8/2023   Chiu ..................... C25D 11/14
                                                    361/807

FOREIGN PATENT DOCUMENTS

JP         2003-043203        2/2003
   KR         10-2009-0010807    1/2009
   KR         10-2010-0101977    9/2010
   KR            10-1080858     11/2011
   KR            10-1087456     11/2011
   KR            10-1682556     12/2016
   KR         10-2017-0006709    1/2017
   KR         10-2017-0105380    9/2017
   KR         10-2017-0134001 A 12/2017
   KR         10-2021-0043110    4/2021
   WO         WO-2020060001 A1 * 3/2020   ............. B32B 17/10
   WO         WO 2021/071095 A1  4/2021

OTHER PUBLICATIONS

Extended European Search Report dated Jun. 18, 2024 for EP Application No. 22828564.9.

* cited by examiner

ELECTRONIC DEVICE INCLUDING HOUSING

CROSS-REFERENCE TO RELATED APPLICATIONS

This application is a continuation of International Application No. PCT/KR2022/002108 designating the United States, filed on Feb. 11, 2022, in the Korean Intellectual Property Receiving Office and claiming priority to Korean Patent Application No. 10-2021-0080906, filed on Jun. 22, 2021, in the Korean Intellectual Property Office, the disclosures of which are incorporated by reference herein in their entireties.

BACKGROUND

Field

The disclosure relates to an electronic device including a housing.

Description of Related Art

In line with remarkable development of information/communication technologies and semiconductor technologies, various types of electronic devices have been widespread and used at an increasing pace. Particularly, recent electronic devices have been developed to be carried and used for communication.

In addition, electronic devices may output stored information as sounds or images. In line with the increasing degree of integration of electronic devices and the widespread use of super-fast large-capacity wireless communication, it has recently become possible to equip a single electronic device (for example, mobile communication terminal) with various functions. For example, not only a communication function, but also an entertainment function (for example, gaming), a multimedia function (for example, music/video playback), communication and security functions for mobile banking and the like, a scheduling function, and an electronic wallet function are integrated in a single electronic device. Such electronic devices have become compact such that users can conveniently carry the same.

In line with recent attention to compactness, flatness, or portability of portable electronic devices (for example, smartphones), there has been ongoing research to make the exterior of electronic devices aesthetic from design viewpoints.

Design-related demands for improving the aesthetic appearance of electronic devices are on the rise. In order to implement various colors or textures, an electronic device may include a housing having a convex and concave pattern formed thereon. However, if a mechanical tool or chemical etching is used, it may be difficult to evenly process the exterior surface of a housing including a difficult-to-cut material (for example, stainless steel or titanium), and a prolonged time may be necessary to process the housing.

SUMMARY

Embodiments of the disclosure may provide a housing including a convex and concave pattern formed substantially uniformly using electro chemical machining Problems addressed by the disclosure are not limited to the above-mentioned problems, and may be variously expanded without deviating from the idea and scope of the disclosure.

According to various example embodiments of the disclosure, an electronic device may include: a housing formed by electro chemical machining (ECM) using a jig on which a second convex and concave pattern is formed, and a processor disposed inside the housing, wherein the housing includes a metal member comprising a metal including a first convex and concave pattern formed in a shape corresponding to a shape of the second convex and concave pattern, and the first convex and concave pattern has at least a portion formed at a substantially uniform pitch and a substantially uniform height.

According to various example embodiments of the disclosure, a method for manufacturing an electronic device may include: an etching process of forming a first convex and concave pattern on the outer surface of a housing of the electronic device by electro chemical machining (ECM) using a jig including a second convex and concave pattern, and an anodizing process of forming an oxide coating layer on the housing.

According to various example embodiments of the disclosure, a housing may include: a metal member comprising a metal including a first convex and concave pattern formed by electro chemical machining (ECM) using a jig on which a second convex and concave pattern is formed, and an oxide coating layer disposed on the first convex and concave pattern, wherein the first convex and concave pattern has at least a portion formed at a substantially uniform pitch and a substantially uniform height, and the metal member includes at least one of titanium, stainless steel, or an amorphous alloy.

A housing of an electronic device according to various example embodiments of the disclosure may be fabricated using ECM. The surface of the housing, which is fabricated using ECM, may have a substantially uniform pitch and a substantially uniform depth.

A method for manufacturing an electronic device according to various example embodiments of the disclosure may manufacture multiple housings substantially simultaneously using ECM. By simultaneously manufacturing multiple housings, the cost and time for manufacturing the housings using ECM may be reduced compared with the cost and time for manufacturing housings using mechanical processing.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
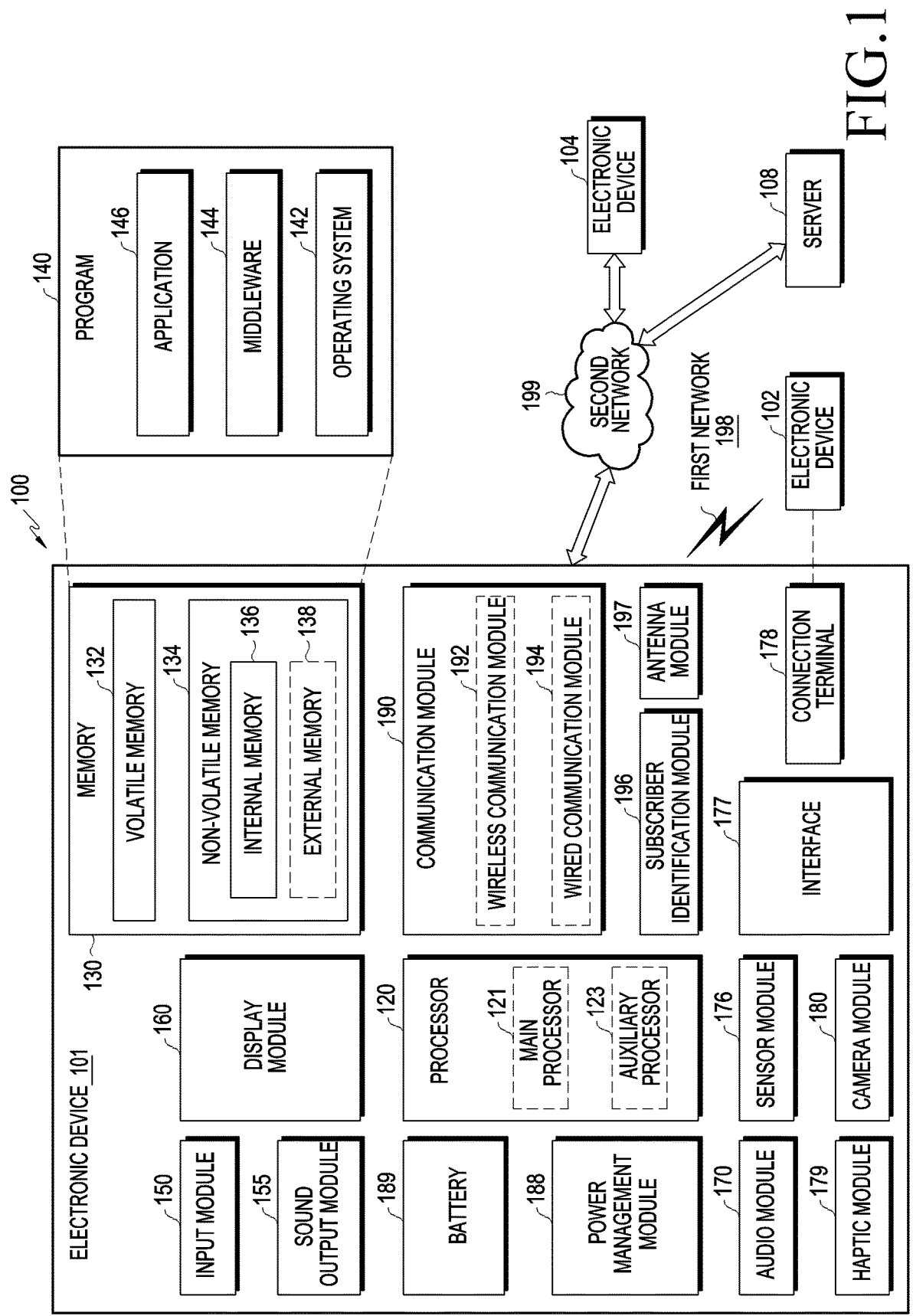
FIG. 1 is a block diagram illustrating an example electronic device in a network environment according to various embodiments.

FIG. 1 is a block diagram illustrating an example electronic device in a network environment according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
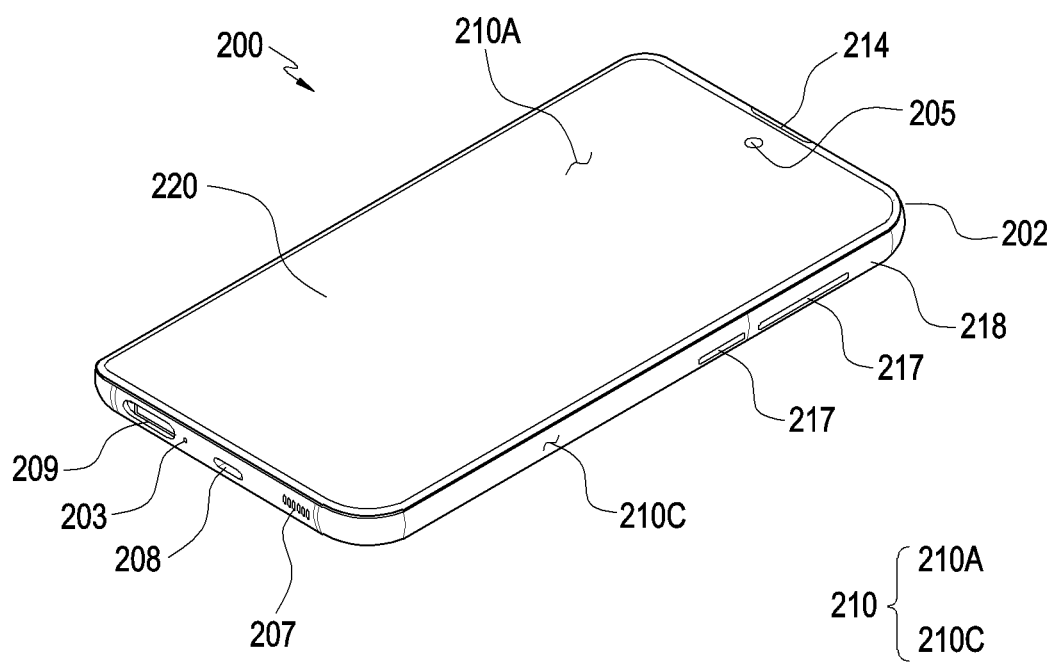
FIG. 2 is a front perspective view of an electronic device according to various embodiments.
Figure 3:
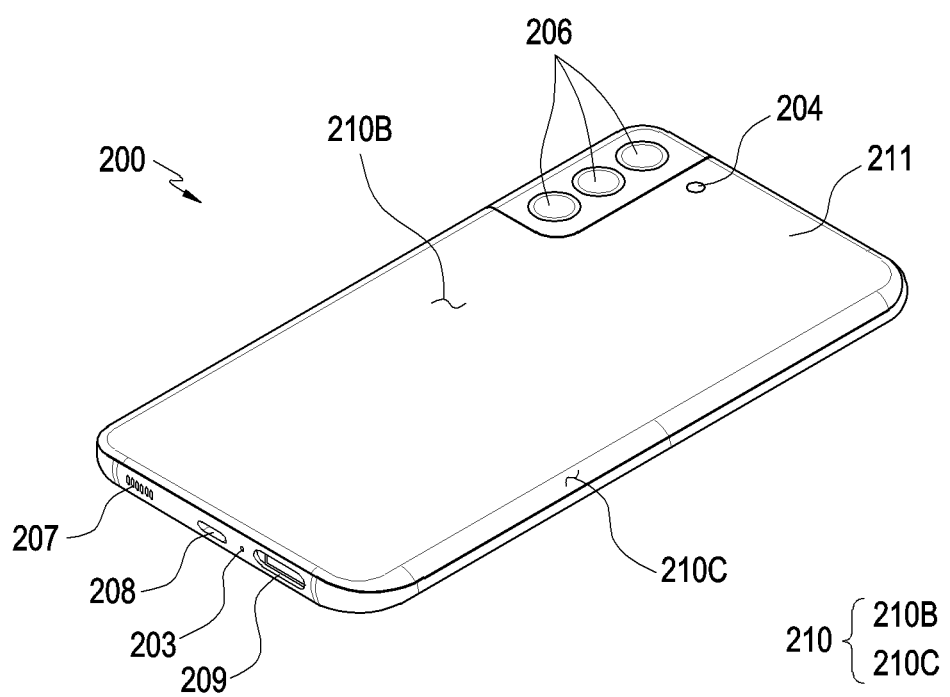
FIG. 3 is a rear perspective view of an electronic device according to various embodiments.

FIG. 2 is a front perspective view of an electronic device according to various embodiments. FIG. 3 is a rear perspective view of an electronic device according to various embodiments.

Referring to FIGS. 2 and 3, the electronic device 200 according to an embodiment may include a housing 210 including a front surface 210A, a rear surface 210B, and side surface 210C surrounding a space between the front surface 210A and the rear surface 210B. In an embodiment (not shown), a structure configuring a part of the front surface 210A of FIG. 2, the rear surface 210B of FIG. 3, and the side surface 210C may be referred to as a housing. For example, the housing 210 may include a front plate 202 and a rear plate 211. According to an embodiment, at least a portion of the front surface 210A may be formed by a front plate 202 (e.g., a glass plate including various coating layers, or a polymer plate) which is substantially transparent. The second surface 210B may be formed by a rear plate 211. The rear plate 211 may be formed by, for example, glass, ceramic, a polymer, a metal (e.g., titanium (Ti), stainless steel (STS), aluminum (Al), and/or magnesium (Mg)), or a combination of at least two of the above materials. The side surface 210C may be formed by a side bezel structure 218 (or "side surface member") that is coupled to the front plate 202 and the rear plate 211 and includes a metal and/or a polymer. In an embodiment, the rear plate 211 and side bezel structure 218 may be integrally formed with each other and include the same material (e.g., glass, a metal material such as aluminum, or ceramic). In an embodiment, the front surface 210A and/or the front plate 202 may be understood as a part of the display 220.

According to an embodiment, the electronic device 200 may include at least one of a display 220, audio modules 203, 207, and 214 (e.g., the audio module 170 of FIG. 1), a sensor module (e.g., the sensor module 176 of FIG. 1), camera modules 205 and 206 (e.g., the camera module 180 of FIG. 1), key input devices 217 (e.g., the input module 150 of FIG. 1), and connector holes 208 and 209 (e.g., the connection terminal 178 of FIG. 1). In an embodiment, one or more of the elements (e.g., the connector hole 209) may be omitted from the electronic device 200 or another element may be added thereto. According to an embodiment, the display 220 may be visually exposed (e.g., visible) through, for example, a substantial portion of the front plate 202.

According to an embodiment, the surface (or the front plate 202) of the housing 210 may include a screen display region formed when the display 220 is visually exposed (e.g., visible). For example, the screen display region may include the front surface 210A.

In an embodiment (not shown), the electronic device 200 may include a recess or opening formed in a portion of the screen display area (e.g., the front surface 210A) of the display 220, and may include at least one of an audio module 214 aligned with the recess or opening, a sensor module (not shown), a light emitting element (not shown), and a camera module 205. In an embodiment (not shown), the rear surface of the screen display region of the display 220 may include at least one of an audio module 214, a sensor module (not shown), a camera module 205, a fingerprint sensor (not shown), and a light emitting element (not shown).

In an embodiment (not shown), the display 220 may be coupled to or disposed adjacent to a touch sensing circuit, a pressure sensor capable of measuring the intensity (pressure) of a touch, and/or a digitizer configured to detect a magnetic field type stylus pen.

In an embodiment, at least one of the key input devices 217 may be disposed on the side bezel structure 218.

According to an embodiment, the audio modules 203, 207, and 214 may include, for example, a microphone hole 203 and speaker holes 207 and 214. The microphone hole 303 may include a microphone disposed inside thereof and configured to acquire external sound, and in an embodiment, may include a plurality of microphones arranged to sense the direction of sound. The speaker holes 207 and 214 may include an external speaker hole 207 and a call receiver hole 214. In an embodiment, the speaker holes 207 and 214 and the microphone hole 203 may be implemented as a single hole, or a speaker may be provided without the speaker holes 207 and 214 (e.g., a piezo speaker).

According to an embodiment, the sensor module (not shown) may generate an electrical signal or a data value corresponding to, for example, an internal operating state of the electronic device 200 or an external environment state. The sensor module (not shown) may include, for example, a first sensor module (not shown) (e.g., a proximity sensor) and/or a second sensor module (not shown) (e.g., a fingerprint sensor) disposed on the front surface 210A of the housing 210. The sensor module (not shown) may include a third sensor module (not shown) (e.g., a HRM sensor) and/or a fourth sensor module (not shown) (e.g., a fingerprint sensor) disposed on the rear surface 210B of the housing 210. In an embodiment (not shown), the fingerprint sensor may be disposed not only on the front surface 210A (e.g., the display 220) of the housing 210 but also on the rear surface 210B thereof. The electronic device 200 may further include a sensor module (not shown), for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor (not shown).

According to an embodiment, the camera modules 205 and 206 may include, for example, a front camera module 205 disposed on the front surface 210A of the electronic device 200, and a rear camera module 206 and/or a flash 204 disposed on the rear surface 210B thereof. The camera modules 205 and 206 may include one or more lenses, an image sensor, and/or an image signal processor. The flash 204 may include, for example, a light emitting diode or a xenon lamp. In an embodiment, two or more lenses (an infrared camera, and a wide-angle and telephoto lens) and image sensors may be disposed on one surface of the electronic device 200.

According to an embodiment, the key input devices 217 may be disposed, for example, on the side surface 210C of the housing 210. In an embodiment, the electronic device 200 may not include one or all of the key input devices 217 mentioned above, and the key input device 217 which is not included therein may be implemented in a different form, such as a soft key, on the display 220.

According to an embodiment, the light emitting device (not shown) may be disposed on the front surface 210A of the housing 210. For example, the light emitting element (not shown) may provide, for example, state information of the electronic device 101 in the form of light. In an embodiment, the light emitting device (not shown) may provide, for example, a light source interworking with the operation of the front camera module 205. The light emitting element (not shown) may include, for example, an LED, an IR LED, and/or a xenon lamp.

According to an embodiment, the connector holes 208 and 209 may include, for example, a first connector hole 208 capable of accommodating a connector (e.g., a USB connector) configured to transmit and receive power and/or data to and from an external electronic device or a connector (e.g., an earphone jack) configured to transmit and receive audio signals to and from an external electronic device, and/or a second connector hole 209 capable of accommodating a storage device (e.g., a subscriber identification module (SIM) card). According to an embodiment, the first connector hole 208 and/or the second connector hole 209 may be omitted.

Figure 4:
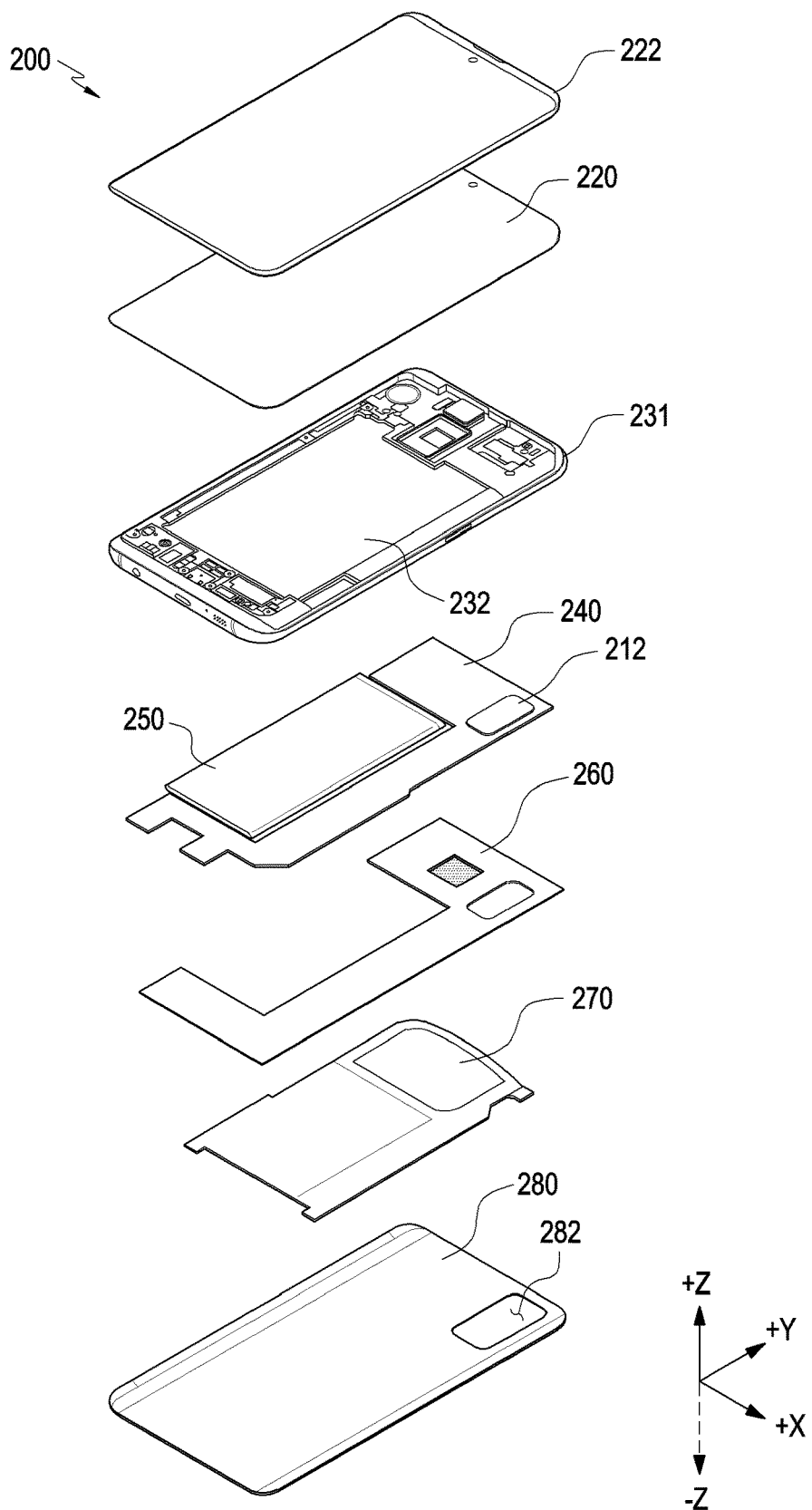
FIG. 4 is an exploded perspective view of an electronic device according to various embodiments.

FIG. 4 is an exploded perspective view of an electronic device according to various embodiments.

Referring to FIG. 4, the electronic device 200 (e.g., the electronic device 200 of FIGS. 2 to 3) may include at least one of a front plate 222 (e.g., the front plate 202 of FIG. 2), a display 220 (e.g., the display 220 of FIG. 2), a first support member 232 (e.g., a bracket), a printed circuit board 240, a battery 250, a second support member 260 (e.g., a rear case), an antenna 270, and a rear plate 280 (e.g., the rear plate 211 in FIG. 3). In an embodiment, one or more (e.g., the first support member 232 or the second support member 260) of the elements may be omitted from the electronic device 200 or another element may be added thereto. At least one of the elements of the electronic device 200 may be the same as or similar to at least one of the elements of the electronic device 200 of FIG. 2 or 3, and overlapping descriptions will be omitted below.

According to an embodiment, the first support member 232 may be disposed inside the electronic device 200 to be connected to the side bezel structure 231 or may be integrally formed with the side bezel structure 231. The first support member 232 may be formed of, for example, a metal material and/or a non-metal material (e.g., a polymer). The first support member 232 may have the display 220 coupled to one surface thereof and the printed circuit board 240 coupled to the other surface thereof. The printed circuit board 240 may be equipped with a processor, a memory, and/or an interface. The processor may include, for example, one or more of a central processing unit, an application processor, a graphics processing unit, an image signal processor, a sensor hub processor, or a communication processor. According to an embodiment, the memory may include, for example, a volatile memory or a non-volatile memory. According to an embodiment, the interface may include, for example, a high definition multimedia interface (HDMI), a universal serial bus (USB) interface, an SD card interface, and/or an audio interface. The interface may, for example, electrically or physically connect the electronic device 200 to an external electronic device, and may include a USB connector, an SD card/MMC connector, or an audio connector. According to an embodiment, the battery 250, which is a device for supplying power to at least one element (e.g., the camera module 212) of the electronic device 200, may include, for example, a non-rechargeable primary battery or a rechargeable secondary battery, or a fuel cell. At least a portion of the battery 250 may be disposed, for example, on a substantially same plane as the printed circuit board 240. The battery 250 may be integrally disposed inside the electronic device 200 or may be disposed to be detachable from the electronic device 200.

According to an embodiment, the second support member 260 (e.g., a rear case) may be disposed between the printed circuit board 240 and the antenna 270. For example, the second support member 260 may include one surface to which at least one of the printed circuit board 240 and the battery 250 is coupled, and the other surface to which the antenna 270 is coupled.

According to an embodiment, the antenna 270 may be disposed between the rear plate 280 and the battery 250. The antenna 270 may include, for example, a near field communication (NFC) antenna, a wireless charging antenna, and/or a magnetic secure transmission (MST) antenna. The antenna 270 may, for example, perform short-range communication with an external device or wirelessly transmit/receive power required for charging. For example, the antenna 270 may include a coil for wireless charging. In an embodiment, an antenna structure may be formed by a part of the side bezel structure 231 and/or the first support member 232 or a combination thereof.

According to various embodiments, the electronic device 200 may include a camera module 212 disposed in a housing (e.g., the housing 210 of FIG. 2). According to an embodiment, the camera module 212 may be disposed on the first support member 232 and may be a rear camera module (e.g., the camera module 212 of FIG. 3) capable of acquiring an image of a subject located in the rear (e.g., −Z direction) of the electronic device 200. According to an embodiment, at least a portion of the camera module 212 may be exposed to the outside of the electronic device 200 through an opening 282 formed through the rear plate 280.

Although the electronic device 200 shown in FIGS. 2 to 4 has a bar type or plate type exterior, the disclosure is not limited thereto. For example, the illustrated electronic device may be a rollable electronic device or a foldable electronic device. The term "rollable electronic device" may refer to an electronic device that includes a display (e.g., the display 220 of FIG. 4) capable of bending deformation such that at least a portion thereof is wound or rolled or accommodated in a housing (e.g., the housing 210 of FIG. 2). According to a user's need, the rollable electronic device may have an expanded screen display region available by unfolding a display or causing a larger area of the display to be visible to the outside. The term "foldable electronic device" may refer to an electronic device that can be folded such that two different regions of a display face each other or face directions opposite to each other. In general, when the foldable electronic device is carried, the display may be folded such that the different regions thereof face each other or face directions opposite to each other, and when the same is used, a user may unfold the display such that the two different regions thereof form a substantially flat plate. In an embodiment, the electronic device 200 according to various embodiments disclosed herein may be understood as various electronic devices including a laptop computer, a wearable electronic device (e.g., a smart watch), or a camera, as well as a portable electronic device such as a smart phone.

Figure 5:
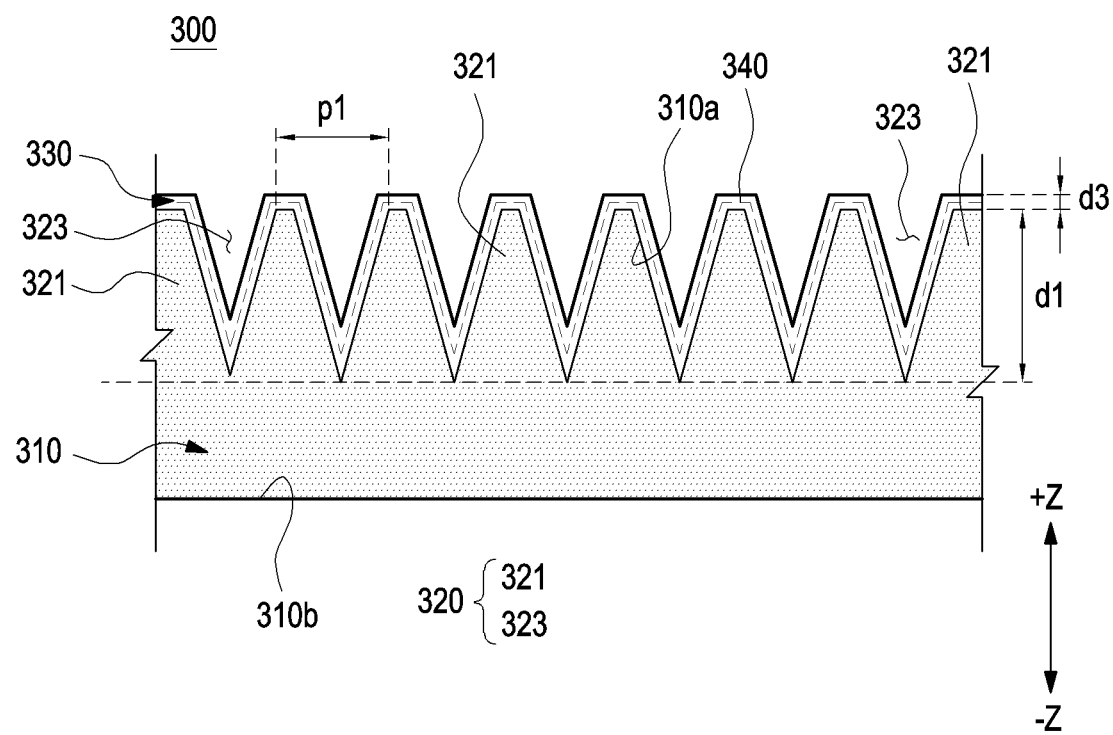
FIG. 5 is a cross-sectional view of a housing according to various embodiments.
Figure 6:
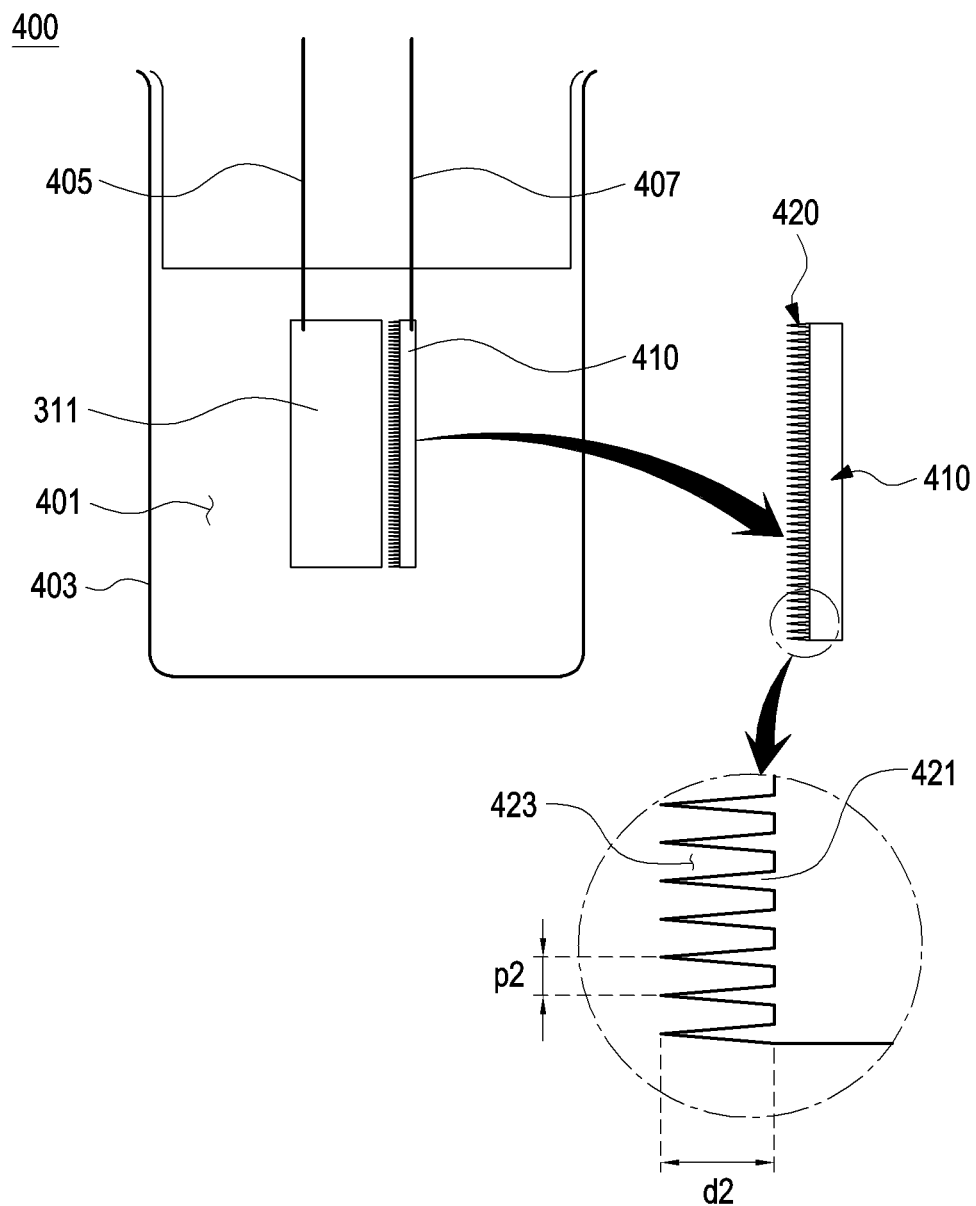
FIG. 6 is a diagram illustrating an example manufacturing process of a housing according to various embodiments.
Figure 7A:
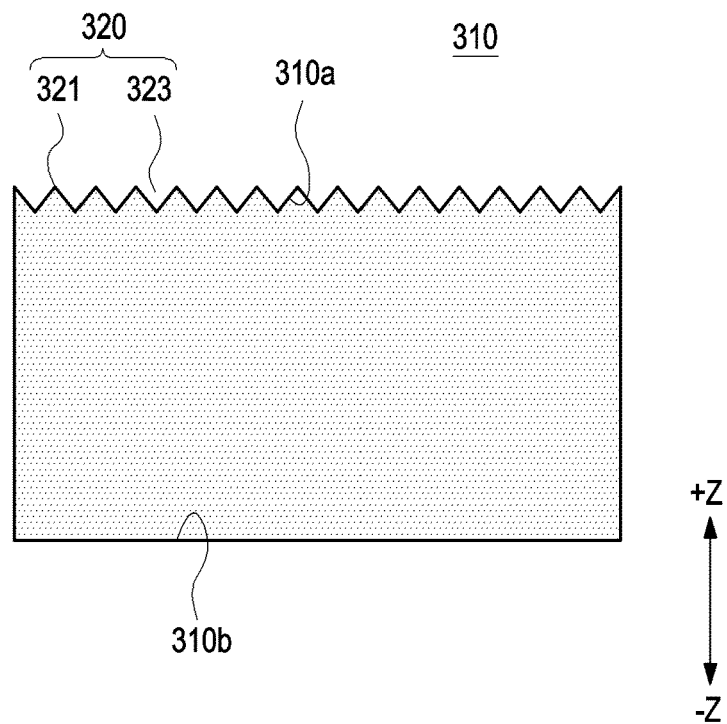
FIGS. 7A, 7B, 7C, and 7D are cross-sectional views of a metal member according to various embodiments \.
Figure 7B:
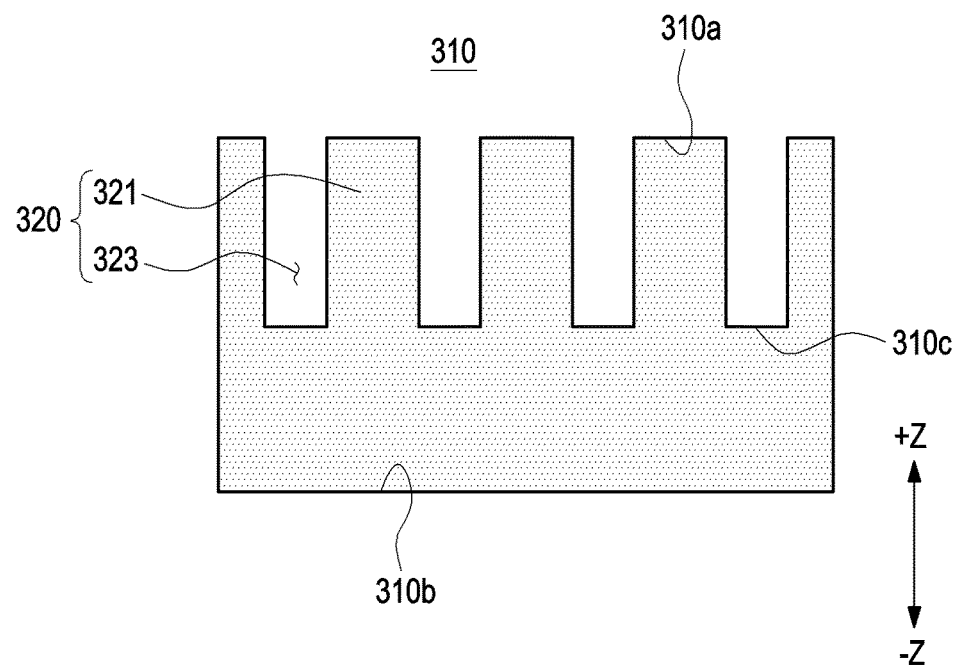
Figure 7C:
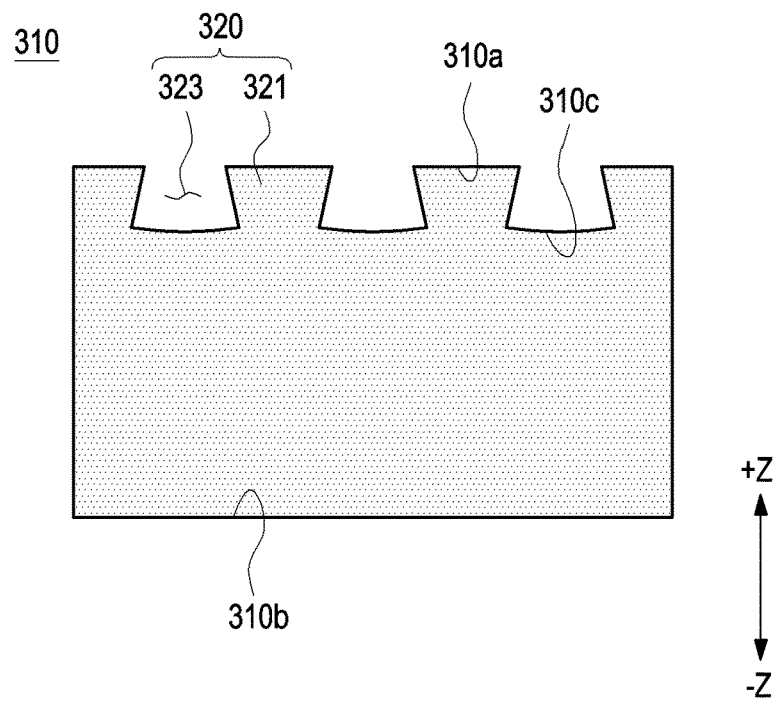
Figure 7D:
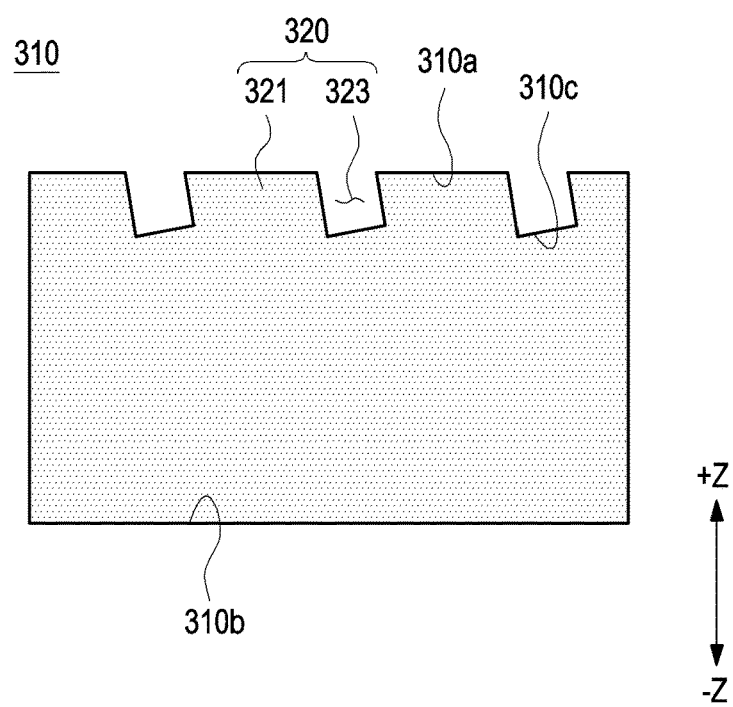

FIG. 5 is a cross-sectional view of a housing 300 according to various embodiments. FIG. 6 is a diagram illustrating an example manufacturing process 400 of a housing, according to various embodiments.

Referring to FIGS. 5 and 6, the housing 300 may include a metal member 310, a first convex and concave pattern 320, and/or an oxide coating layer 330. The first convex and concave pattern 320 of the metal member 310 may be formed using a jig 410 including a second convex and concave pattern 420. The configuration of the housing 300 of FIG. 5 may be all or partly the same as that of the housing 210 of FIGS. 2 and 3.

According to various embodiments, the housing 300 may form at least a part of the exterior of the electronic device (e.g., the electronic device 200 of FIG. 2), and may accommodate at least a part of a component (e.g., the processor 120 of FIG. 1) of the electronic device 200. For example, the housing 300 may include at least one of a side bezel structure (e.g., the side bezel structure 231 of FIG. 4), a first support member (e.g., the first support member 232 of FIG. 4), and/or a rear plate (e.g., the rear plate 280 of FIG. 4). As another example, the electronic device may be understood as a wearable electronic device (e.g., a smart watch), and the housing 300 may be understood as a bezel ring structure (not shown) of the wearable electronic device.

According to various embodiments, the manufacturing process 400 of the housing 300 may include electro chemical machining (ECM). For example, the electro chemical machining may include a machining method using electrolysis. According to an embodiment, the first convex and concave pattern 320 of the metal member 310 may be formed using electro chemical machining (ECM). For example, in the manufacturing process 400 of the housing 300 and/or the metal member 310, a metal blank 311 and the jig 410 may be introduced into an electrolyte 401 located in a container 403. According to an embodiment, the metal blank 311 may be electrically connected to a positive electrode using a first electric wire 405, and the jig 410 may be electrically connected to a negative electrode using a second electric wire 407. According to an embodiment, while the metal blank 311 and the jig 410 are located in the electrolyte 401, the surface of the metal blank 311 connected to the positive electrode may be formed to correspond to the shape of the second convex and concave pattern 420 connected to the negative electrode.

According to various embodiments, the electrolyte 401 may be a low-concentration slightly acidic solution. For example, the electrolyte 401 may include sodium chloride (NaCl) and/or sodium nitrate (NaNO3).

According to various embodiments, the jig 410 may include the second convex and concave pattern 420. The second convex and concave pattern 420 may include a plurality of second protrusions 421 and a plurality of second grooves 423. The second protrusions 421 and/or the second grooves 423 may be formed at a second depth (d2) and may be arranged at a second pitch (p2). According to an embodiment, the first convex and concave pattern (e.g., the first convex and concave pattern 320 of FIG. 5) may be formed in a shape corresponding to the second convex and concave pattern 420. For example, the first height (e.g., the first depth (d1) of FIG. 5) of the first protrusion (e.g., the first protrusion 321 of FIG. 5) may be substantially equal to the second height (d2) of the second protrusion 421. The first pitch (e.g., the first pitch (p1) of FIG. 5) at which the plurality of first protrusions 321 are arranged may be substantially equal to the second pitch (p2) at which the plurality of second protrusions 421 are arranged.

According to an embodiment, the rigidity of the jig 410 may be lower than that of the metal member 310 and/or the metal blank 311. For example, the second convex and concave pattern 420 may be formed using a mechanical tool and/or chemical etching. According to an embodiment, the metal blank 311 may be spaced apart from the jig 410 while the metal blank 311 and the jig 410 are located in the electrolyte 401.

According to various embodiments, the metal member 310 may include the first convex and concave pattern 320. According to an embodiment, the metal member 310 may be understood as the metal blank 311 having the first convex and concave pattern 320 formed using the jig 410 including the second convex and concave pattern 420. According to an embodiment, the first convex and concave pattern 320 may include the plurality of first protrusions 321 and the plurality of first grooves 323. According to an embodiment, the first convex and concave pattern 320 of the metal member 310 may be formed in a shape corresponding to the second convex and concave pattern 420 of the jig 410. For example, the first groove 323 may be formed in a portion of the metal blank 311 facing the second protrusion 421 of the second convex and concave pattern 420, and the first protrusion 321 may be formed in a portion of the metal blank 311 facing the second groove 423 of the second convex and concave pattern 420. According to an embodiment, since the first convex and concave pattern 320 is formed using electro chemical machining, the first convex and concave pattern 320 may be formed to have a substantially uniform pitch and/or a substantially uniform height. According to an embodiment, the height of the first convex and concave pattern 320 may be changed based on a processing time and/or strength of a voltage transferred to the jig 410. The first convex and concave pattern 320 formed at a substantially uniform pitch and/or a substantially uniform height may be understood as the first convex and concave pattern 320 formed uniformly at a specified pitch and/or height in a designated region of the housing 300, and should not be understood as a structure in which a pitch and/or height of the first convex and concave pattern 320 is not a structure in which a pitch and/or height of the convex and concave pattern 320 is formed to be the same throughout the housing 300. According to an embodiment, the metal member 310 may include a first surface 310a facing the outside of the electronic device (e.g., the electronic device 200 of FIG. 2) and a second surface 310a facing the inside of the electronic device 200. According to an embodiment, the first protrusion 321 may form at least a portion of the first surface 310a.

According to an embodiment, the metal member 310 may be a difficult-to-cut material. For example, the metal member 310 may include at least one of titanium (Ti), stainless steel (STS), or an amorphous alloy. The amorphous alloy may be understood as a metal including atoms irregularly arranged using rapid cooling. The metal member 310 including a difficult-to-cut material may be processed using the electro chemical machining. According to an embodiment, the metal member 310 may include at least one of aluminum (Al) and magnesium (Mg).

According to an embodiment, the manufacturing time and/or manufacturing cost of the metal member 310 including the first convex and concave pattern 320 formed using electro chemical machining may be lower than the manufacturing time and/or manufacturing cost of the metal member 310 including a convex and concave pattern (not shown) formed using a mechanical tool and/or chemical etching. For example, the plurality of metal blanks 311 may be machined in the container 403 at substantially the same time.

According to various embodiments, the texture and/or exterior of the housing 300 may be determined based on a shape of the first convex and concave pattern 320. For example, based on the pitch and/or height of the first convex and concave pattern 320, the refractive index and/or diffuse reflection ratio of light incident onto the housing 300 may be changed, and the color and/or texture of the housing 300 may be changed.

According to an embodiment, the gloss of the housing 300 may be determined based on the first height (d1) of the first protrusion 321 (or the first height of the first groove 323). For example, as the first height (d1) decreases, the gloss of the housing 300 may increase. According to an embodiment, the first height (d1) of the first protrusion 321 may be in a range of about 30 to 100 μm. The first height (d1) may be understood as a first depth of the first groove 323.

According to an embodiment, the texture and/or color of the housing 300 may be determined based on a first pitch (p1) of the plurality of first protrusions 321. For example, as the first pitch (p1) shortens, the roughness of the housing 300 perceived by a user may be reduced. According to an embodiment, the first pitch (p1) of the first protrusions 321 may be in a range of about 20 to 120 μm. The first pitch (p1) may be understood as an interval between the plurality of first grooves 323.

According to various embodiments, the housing 300 may include an oxide coating layer 330. According to an embodiment, the oxide coating layer 330 may be disposed on the metal member 310. For example, the oxide coating layer 330 may be positioned in the first direction (+Z direction) facing the outside of the housing 300.

According to an embodiment, the oxide coating layer 330 may be formed on the metal member 310 using various methods. For example, the oxide coating layer 330 may be formed by at least one of a coating method, anodizing method, plating method, or chemical conversion in a direction (e.g., the first direction (+Z direction)) facing the outside of the housing 300 from the metal member 310. For example, the oxide coating layer 330 may be formed on the plurality of first protrusions 321 of the first convex and concave pattern 320.

According to an embodiment, when an external force is applied to the housing 300, the oxide coating layer 330 which is exposed to the outside may protect the metal member 310 from external impact. According to an embodiment, exposure of the metal member 310 to the outside may be prevented and/or reduced by the oxide coating layer 330. The metal member 310 of the housing 300 including the oxide coating layer 330 may have durability and corrosion resistance which are higher than the durability and corrosion resistance of the metal member 310 of the housing which does not include the oxide coating layer 330. According to an embodiment, a first thickness (d3) of the oxide coating layer 330 may be in a range of about 40 to 60 μm.

According to various embodiments, the housing 300 may include a color layer 340. According to an embodiment, the color layer 340 may be formed on at least a portion of the oxide coating layer 330. According to an embodiment, the color layer 340 may be formed on the oxide coating layer 330 using at least one of a dipping method or an electrolytic coloring method. The dipping method may be understood as a method of depositing a solution in which a paint is dissolved on the oxide coating layer 330 to implement a color from the diffused and adsorbed paint. The electrolytic coloring method may be understood as a method of electrolytically implementing a color on the oxide coating layer 330 using a metal salt during or after the formation of the oxide coating layer 330. According to an embodiment, the color layer 340 may include a paint for expressing a color and thus may provide various colors.

FIGS. 7A, 7B, 7C, and 7D are cross-sectional views of an example metal member according to various embodiments.

Referring to FIGS. 7A, 7B, 7C, and 7D, the metal member 310 may be formed in various shapes. According to an embodiment, the metal member 310 may include the first convex and concave pattern 320 having various shapes. The color and/or texture of the housing (e.g., the housing 300 of FIG. 5) may be changed based on the shape of the first convex and concave pattern 320. For example, based on the shape of the first convex and concave pattern 320, a diffusely reflected amount of light incident onto the housing (e.g., the housing 300 of FIG. 5) and/or a refracted angle of the light may be changed and the color and/or texture of the housing 300 recognized by a user may be changed. The configuration of the metal member 310 of FIGS. 7A, 7B, 7C, and 7D may be all or partly the same as that of the metal member 310 of FIG. 5.

According to various embodiments, the first convex and concave pattern 320 may be arranged in various directions. For example, the first convex and concave pattern 320 may include the plurality of first protrusions 321 extending in the longitudinal direction (e.g., Y-axis direction) or the width direction (e.g., X-axis direction) of the electronic device (e.g., the electronic device 200 of FIG. 4) and protruding in the thickness direction (e.g., the first direction (+Z direction)) of the electronic device 200. As another example, the first convex and concave pattern 320 may include the plurality of first protrusions 321 arranged in a shape of check board array in the first direction (+Z direction).

According to an embodiment (e.g., FIG. 7A), the metal member 310 may include the first convex and concave pattern 320 having a substantially triangular cross section.

According to various embodiments (e.g., FIGS. 7B, 7C, and 7D), the metal member 310 may include the first convex and concave pattern 320 having a rectangular cross section. For example, the metal member 310 may include a first surface 310a forming at least a portion of the first protrusion 321, a second surface 310b opposite to the first surface 310a and facing the inside of the electronic device (e.g., the electronic device 200 of FIG. 2), and a third surface 310c positioned between the plurality of first protrusions 321. The first groove 323 may be understood as an empty space surrounded by the first surface 310a and the third surface 310c. According to an embodiment (e.g., FIG. 7B), the first protrusion 321 and/or the first groove 323 may have a substantially rectangular shape. According to an embodiment (e.g., FIG. 7C), the first protrusion 321 and/or the first groove 323 of the first convex and concave pattern 320 may be formed in a substantially symmetrical trapezoidal shape. According to an embodiment (e.g., FIG. 7D), the first protrusion 321 and/or the first groove 323 of the first convex and concave pattern 320 may be formed in a substantially asymmetric trapezoidal shape.

The first convex and concave pattern 320 having a triangular or quadrangular shape is illustrated in FIGS. 7A to 7D, but the shape of the first convex and concave pattern 320 is not limited thereto. For example, the second convex and concave pattern (e.g., the second convex and concave pattern 420 of FIG. 6) may be formed in a substantially polygonal and/or partially curved shape, and the first convex and concave pattern 320 may be formed in a shape corresponding to the second convex and concave pattern 420.

According to various embodiments, the metal member 310 may include the first convex and concave pattern 320 having a different shape according to each region thereof. For example, a portion of the metal member 310 may include the first convex and concave pattern 320 of FIG. 7A, and another portion thereof may include the first convex and concave pattern 320 of at least one of FIGS. 7B, 7C, or 7D.

Figure 8A:
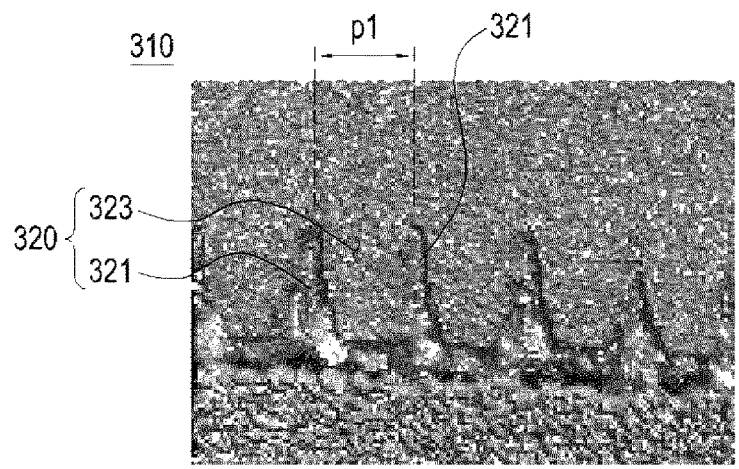
FIGS. 8A, 8B, and 8C are photographs of a cross section of a metal member including a first convex and concave pattern formed at a different pitch, according to various embodiments.
Figure 8B:
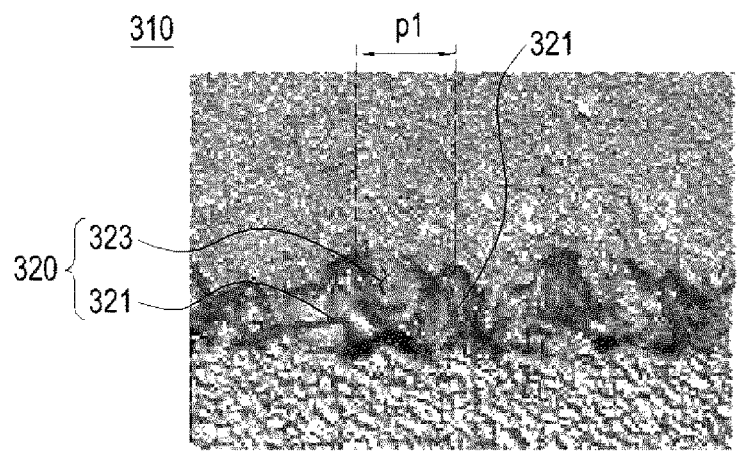
Figure 8C:
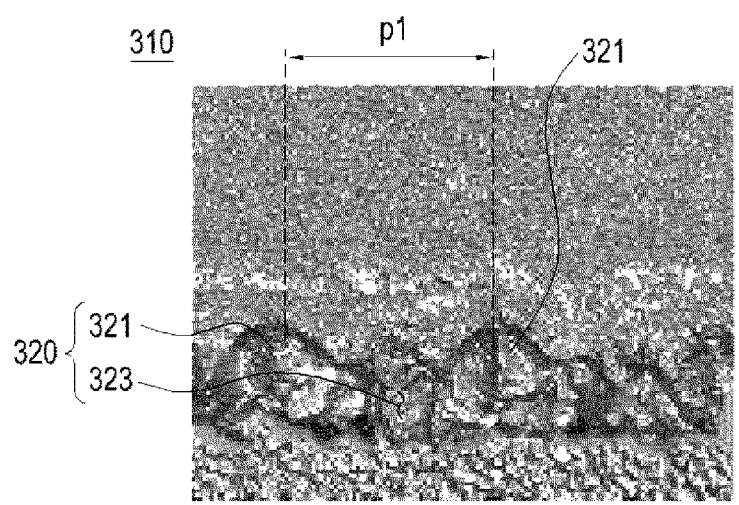
Figure 9A:
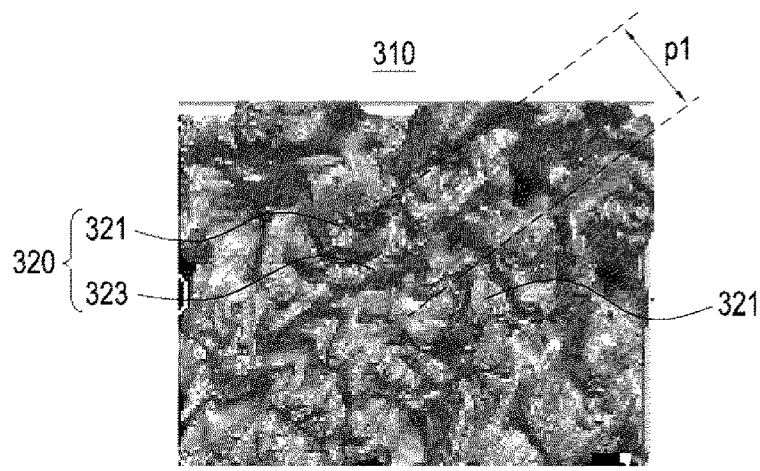
FIGS. 9A, 9B, and 9C are photographs of the upper portion of a metal member including a first convex and concave pattern formed at a different pitch, according to various embodiments.
Figure 9B:
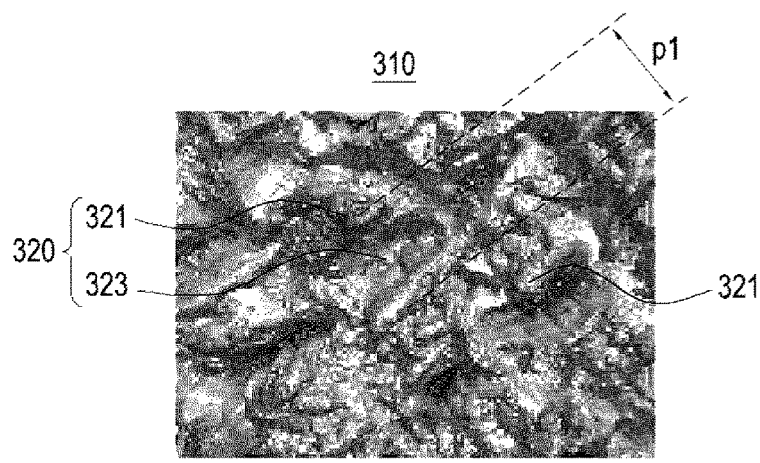
Figure 9C:
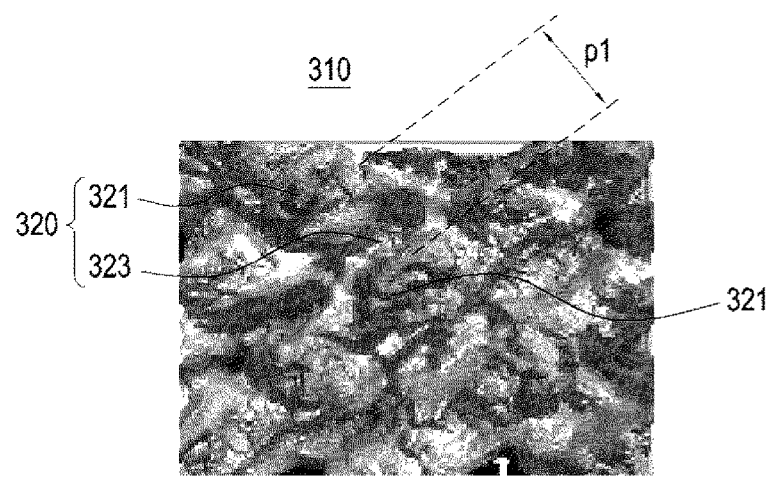

FIGS. 8A, 8B, and 8C are photographs of a cross section of a metal member including a first convex and concave pattern formed at a different pitch, according to various embodiments. FIGS. 9A, 9B, and 9C are photographs of the upper portion of a metal member including a first convex and concave pattern formed at a different pitch, according to various embodiments.

Referring to FIGS. 8A, 8B, 8C, 9A, 9B, and 9C, the first convex and concave pattern 320 of the metal member 310 may be arranged at a first pitch (p1). For example, the plurality of first protrusions 321 and/or each of the plurality of first grooves 323 may be arranged at a first pitch (p1), respectively. The configuration of the metal member 310 and the first convex and concave pattern 320 in FIGS. 8A, 8B, 8C, 9A, 9B, and 9C may be all or partly the same as that of the metal member 310 and the first convex and concave pattern 320 in FIG. 5.

According to various embodiments, the first pitch (p1) may be variously configured to adjust the texture and/or color of the housing (e.g., the housing 300 of FIG. 5). For example, the first pitch (p1) may be in a range of about 20 to 120 μm. According to an embodiment (e.g., FIGS. 8A and 9A), the first pitch (p1) may be in a range of about 80 to 120 μm. According to an embodiment (e.g., FIGS. 8B and 9B), the first pitch (p1) may be in a range of about 50 to 80 μm.

According to an embodiment (e.g., FIGS. 8C and 9C), the first pitch (p1) may be in a range of about 20 to 50 µm.

According to various embodiments, the metal member 310 may include the first convex and concave pattern 320 arranged at a first pitch (p1) different according to each region. For example, a pitch (e.g., FIGS. 8A and 9A) at which a part of the first convex and concave pattern 320 is arranged may be different from a pitch (e.g., FIGS. 8B, 8C, 9B, and/or FIG. 9C) at which another part of the first convex and concave pattern 320 is arranged.

Figure 10A:
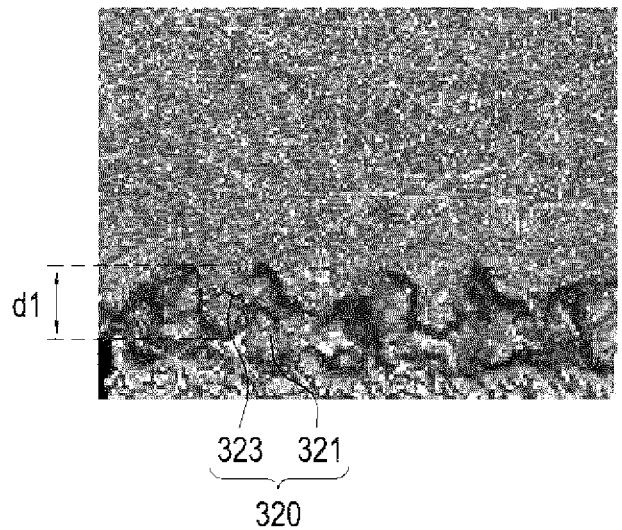
FIGS. 10A, 10B, and 10C are photographs of a cross section of a metal member including a first convex and concave pattern formed at a different depth, according to various embodiments.
Figure 10B:
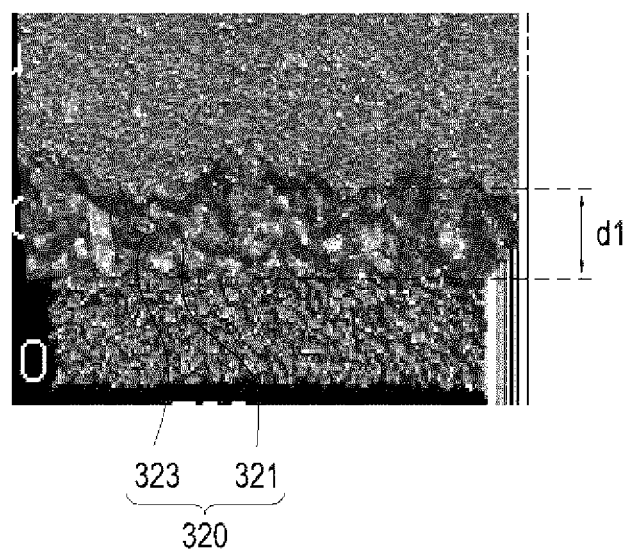
Figure 10C:
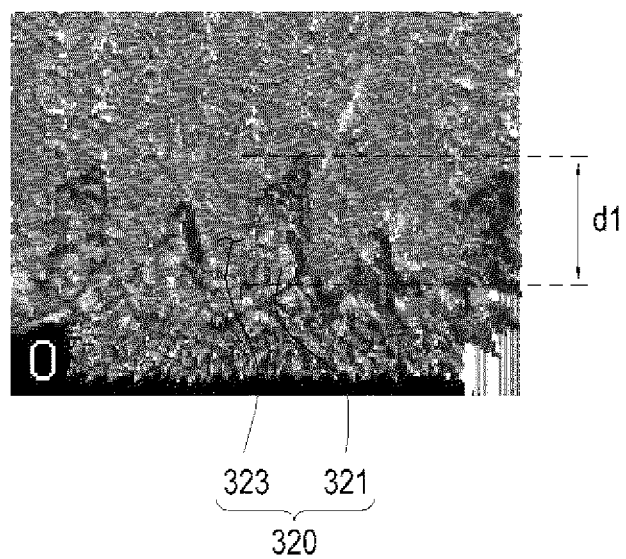

FIGS. 10A, 10B, and 10C are photographs of a cross section of a metal member including a first convex and concave pattern formed at a different height, according to various embodiments.

Referring to FIGS. 10A, 10B, and 10C, the first convex and concave pattern 320 of the metal member 310 may be formed to have a first height (d1). For example, the first convex and concave pattern 320 may include a plurality of first protrusions 321 having a first height (d1). The configuration of the metal member 310 and the first convex and concave pattern 320 of FIGS. 10A, 10B, and 10C may be all or partly the same as that of the metal member 310 and the first convex and concave pattern 320 of FIG. 5.

According to various embodiments, the first height (d1) may be variously configured to adjust the texture and/or color of the housing (e.g., the housing 300 of FIG. 5). For example, the first height (d1) may be in a range of about 30 to 100 µm. According to an embodiment (e.g., FIG. 10A), the first height (d1) may be in a range of about 30 to 50 µm. According to an embodiment (e.g., FIG. 10B), the first height (d1) may be in a range of about 50 to 70 µm. According to an embodiment (e.g., FIG. 10C), the first height (d1) may be in a range of about 70 to 100 µm.

According to various embodiments, the metal member 310 may include the first convex and concave pattern 320 formed at a first height (d1) which is different according to each region. For example, a height (e.g., FIG. 10A) at which a part of the first convex and concave pattern 320 is formed may be different from a depth (e.g., FIG. 10B and/or FIG. 10C) at which another part of the first convex and concave pattern 320 is formed.

Figure 11:
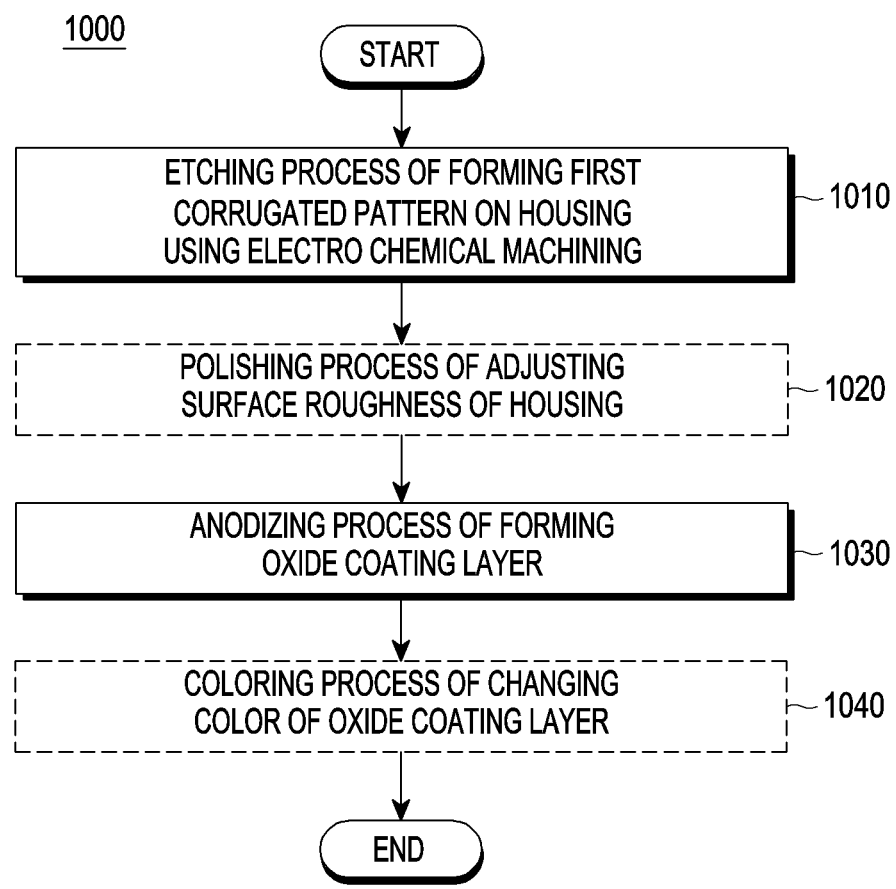
FIG. 11 is a flowchart illustrating an example manufacturing process of an electronic device according to various embodiments.

FIG. 11 is a flowchart illustrating an example manufacturing process of an electronic device according to various embodiments of the disclosure.

Referring to FIG. 11, a manufacturing process 1000 of an electronic device (e.g., the electronic device 200 of FIG. 2) may include an etching process 1010 of forming the first convex and concave pattern 320 on the housing 300 using electro chemical machining, and an anodizing process 1030 of forming an oxide coating layer 330. The configuration of the first convex and concave pattern 320 and the oxide coating layer 330 of the housing 300 in FIG. 11 may be all or partly the same as that of the first convex and concave pattern 320 and the oxide coating layer 330 of the housing 300 in FIG. 5.

According to various embodiments, the etching process 1010 may form the first convex and concave pattern 320 on the housing 300 using a jig (e.g., the jig 410 of FIG. 6) on which the second convex and concave pattern (e.g., the second convex and concave pattern 420 of FIG. 6) is formed. For example, the etching process 1010 may be understood as a process of changing a metal blank (e.g., the metal blank 311 of FIG. 6) using electro chemical machining (ECM) to the first metal member 310 including the first convex and concave pattern 320 such that the metal blank corresponds to the shape of the second convex and concave pattern 420. According to an embodiment, the metal blank 311 may be positioned in the electrolyte 401 while facing the jig 410 on which the second convex and concave pattern 420 is formed. The metal blank 311 may be electrolyzed to correspond to the shape of the second convex and concave pattern 420. According to an embodiment, sparks may not be generated in the etching process 1010 using electro chemical machining. Accordingly, the deformation of the jig in the etching process 1010 using electro chemical machining may be less than that of the jig in an etching process using mechanical machining.

According to various embodiments, the manufacturing process 1000 of an electronic device may include a polishing process 1020 of adjusting the surface roughness of the housing 300. According to an embodiment, the polishing process 1020 may include a blasting process. For example, the polishing process 1020 may reduce the surface roughness of the outer surface (e.g., the first surface 310a of FIG. 5) of the metal member (e.g., the metal member 310 of FIG. 5) using at least one of media blasting or sand blasting. According to an embodiment, the polishing process 1020 may include a barrel polishing process. According to an embodiment, the color and/or texture of the housing 300 (e.g., the metal member 310 of FIG. 5) may be adjusted using the polishing process 1020.

According to various embodiments, the anodizing process 1030 may form an oxide coating layer 330 on the outer surface of the housing 300. For example, the oxide coating layer 330 may be formed on the outer surface (e.g., the first surface 310a of FIG. 5A) of the metal member (e.g., the metal member 310 of FIG. 5). According to an embodiment, at least a portion of the oxide coating layer 330 may be formed on the first convex and concave pattern (e.g., the first convex and concave pattern 320 of FIG. 5) and be exposed to the outside of the housing 300.

According to an embodiment, the anodizing process 1030 may be replaced with another process of forming the oxide coating layer 330. For example, the manufacturing process 1000 of the electronic device (e.g., the electronic device 200 of FIG. 2) may include a coating method, a plating method, or chemical conversion process for forming the oxide coating layer 330.

According to various embodiments, the manufacturing process 1000 of the electronic device may include a coloring process 1040 of changing the color of the oxide coating layer 330. For example, the coloring process 1040 may form a color layer (e.g., the color layer 340 of FIG. 5) on at least a portion of the oxide coating layer 330. According to an embodiment, the coloring process 1040 may include at least one of a dipping method or an electrolytic coloring method.

According to various example embodiments of the disclosure, an electronic device (e.g., the electronic device 200 of FIG. 2) may include: a housing (the housing 300 of FIG. 5), a processor (e.g., the processor 120 of FIG. 1) disposed inside the housing, the housing may include a metal member comprising a metal and (e.g., the metal member 310 of FIG. 5) including a first convex and concave pattern (e.g., the first convex and concave pattern 320 of FIG. 5) formed in a shape corresponding to a shape of a second convex and concave pattern formed on a jig, wherein the jig is formed for use in electro chemical machining (ECM), and the first convex and concave pattern may have at least a portion formed at a substantially uniform pitch and a substantially uniform height.

According to various example embodiments, the metal member may include at least one of titanium, stainless steel, or an amorphous alloy.

According to various example embodiments, the first convex and concave pattern may include a plurality of protrusions (e.g., the protrusions 321 of FIG. 5) having a first height (e.g., the first height (d1) of FIG. 5) in a range of about 30 to 100 μm.

According to various example embodiments, the first convex and concave pattern may include a plurality of protrusions (e.g., the protrusions 321 of FIG. 9A) arranged at a first pitch (e.g., the first pitch (p1) of FIG. 9A) in a range of about 20 to 120 μm.

According to various example embodiments, the housing may include an oxide coating layer (e.g., the oxide coating layer 330 of FIG. 5) disposed on the metal member.

According to various example embodiments, the oxide coating layer may have a first thickness (e.g., the first thickness (d3) of FIG. 5) in a range of about 40 to 60 μm.

According to various example embodiments, the housing may include a color layer (e.g., the color layer 340 of FIG. 5) formed on the oxide coating layer.

According to various example embodiments, the second convex and concave pattern may include a plurality of second protrusions (e.g., the second protrusion 421 of FIG. 6) formed at a second depth (e.g., the second depth (d2) of FIG. 6) and arranged at a second pitch (e.g., the second pitch (p2) of FIG. 6), and the first convex and concave pattern may include a plurality of first protrusions (e.g., the first protrusion 321 of FIG. 5) formed at a first depth (e.g., the first depth (d1) of FIG. 5) substantially equal to the second depth and arranged at a first pitch (e.g., the first pitch (p1) of FIG. 5) substantially equal to the second pitch.

According to various example embodiments, the housing may include a rear plate (e.g., the rear plate 280 of FIG. 4).

According to various example embodiments of the disclosure, a method for manufacturing an electronic device (e.g., the manufacturing process 1000 of the electronic device of FIG. 11) may include: an etching process (e.g., the etching process 1010 of FIG. 11) of forming a first convex and concave pattern (e.g., the first convex and concave pattern 320 of FIG. 5) on the outer surface (e.g., the first surface 310a of FIG. 5) of the housing (e.g., the housing 300 of FIG. 5) of the electronic device by electro chemical machining (ECM) using a jig (e.g., jig 410 of FIG. 6) including a second convex and concave pattern (e.g., the second convex and concave pattern 420 of FIG. 6), and an anodizing process (e.g., the anodizing process 1030 of FIG. 13) of forming an oxide coating layer on the housing.

According to various example embodiments, the method for manufacturing the electronic device may further include a polishing process (e.g., the polishing process 1020 of FIG. 11) for adjusting the surface roughness of the housing.

According to various example embodiments, the polishing process may include at least one of a blasting process or a barrel polishing process.

According to various example embodiments, the method for manufacturing the electronic device may further include a coloring process (e.g., the coloring process 1040 of FIG. 11) of changing a color of the oxide coating layer.

According to various example embodiments, the housing may include at least one of titanium, stainless steel, or an amorphous alloy.

According to various example embodiments, the second convex and concave pattern may include a plurality of second protrusions (e.g., the second protrusion 421 of FIG. 6) formed at a second depth (e.g., the second depth (d2) of FIG. 6) and arranged at a second pitch (e.g., the second pitch (p2) of FIG. 6), and the first convex and concave pattern may include a plurality of first protrusions (e.g., the first protrusion 321 of FIG. 5) formed at a first depth (e.g., the first depth (d1) of FIG. 5) substantially equal to the second depth and arranged at a first pitch (e.g., the first pitch (p1) of FIG. 5) substantially equal to the second pitch.

A housing (e.g., the housing 300 of FIG. 5) according to various example embodiments of the disclosure may include: a metal member comprising a metal and (e.g., the metal member 310 of FIG. 5) including a first convex and concave pattern (e.g., the first convex and concave pattern 320 of FIG. 5) corresponding to a second convex and concave pattern (e.g., the second convex and concave pattern 420 of FIG. 6) formed on a jig, the jig being formed for use in electro chemical machining (ECM), and an oxide coating layer (e.g., the oxide coating layer 330 of FIG. 5) disposed on the first convex and concave pattern, the first convex and concave pattern may have at least a portion formed at a substantially uniform pitch and a substantially uniform depth, and the metal member may include at least one of titanium, stainless steel, or an amorphous alloy.

According to various example embodiments, the first convex and concave pattern may include a plurality of first protrusions (e.g., the first protrusion 321 of FIG. 5) having a first depth (e.g., the first depth (d1) of FIG. 5) in a range of about 30 to 100 μm.

According to various example embodiments, the first convex and concave pattern may include a plurality of first protrusions (e.g., the first protrusion 321 of FIG. 5) arranged at a first pitch (e.g., the first pitch (p1) of FIG. 5) in a range of about 20 μm to 120 μm.

According to various example embodiments, the oxide coating layer may have a first thickness (e.g., the first thickness (d3) of FIG. 5) in a range of about 40 to 60 μm.

According to various example embodiments, the second convex and concave pattern may include a plurality of second protrusions (e.g., the second protrusion 421 of FIG. 6) formed at a second depth (e.g., the second depth (d2) of FIG. 6) and arranged at a second pitch (e.g., the second pitch (p2) of FIG. 6), and the first convex and concave pattern may include a plurality of first protrusions (e.g., the first protrusion 321 of FIG. 5) formed at a first depth (e.g., the first depth (d1) of FIG. 5) substantially equal to the second depth and arranged at a first pitch (e.g., the first pitch (p1) of FIG. 5) substantially equal to the second pitch.

The electronic device including the housing described above in the disclosure is not limited to the above-described embodiments and drawings, and it will be apparent to those of ordinary skill in the art of the disclosure that various substitutions, modifications, and variations are possible within the technical scope of the disclosure. It will also be understood that any of the embodiment(s) described herein may be used in conjunction with any other embodiment(s) described herein.

What is claimed is:

1. An electronic device comprising:
a housing; and
at least one processor disposed inside the housing,
wherein the housing comprises:
a metal member comprising a metal including an electro chemical machined first convex and concave pattern formed into a surface of the metal member, and
an oxide inclusive coating layer exposed to an outside of the housing and disposed on a surface of the first convex and concave pattern of the metal with a shape corresponding to the shape of the first convex and concave pattern, and wherein the first convex and concave pattern has at least a portion formed at a substantially uniform pitch and a substantially uniform height.

2. The electronic device of claim 1, wherein the metal member comprises at least one of titanium, stainless steel, or an amorphous alloy.

3. The electronic device of claim 1, wherein the first convex and concave pattern comprises a plurality of protrusions having a first height in a range of 30 to 100 µm.

4. The electronic device of claim 1, wherein the first convex and concave pattern comprises a plurality of protrusions arranged at a first pitch defining a distance between features in a range of 20 to 120 µm.

5. The electronic device of claim 1, wherein the oxide inclusive coating layer has a first thickness in a range of 40 to 60 µm.

6. The electronic device of claim 1, wherein the housing comprises a color layer formed on the oxide coating layer.

7. The electronic device of claim 1, wherein the first convex and concave pattern is formed in a shape corresponding to a shape of a second convex and concave pattern formed on a jig, the second convex and concave pattern comprising a plurality of second protrusions formed at a second height and arranged at a second pitch, and
the first convex and concave pattern comprises a plurality of first protrusions formed at a first height substantially equal to the second height and arranged at a first pitch substantially equal to the second pitch.

8. The electronic device of claim 1, wherein the housing comprises a rear plate.

9. The electronic device of claim 1, wherein the metal member comprises a first portion in which the first convex and concave pattern is formed and a second portion in which a third convex and concave pattern is different from the first convex and concave pattern.

10. The electronic device of claim 9, wherein the third convex and concave pattern includes a rectangular cross section.

11. The electronic device of claim 9, wherein the third convex and concave pattern includes quadrangular shape cross section.

12. The electronic device of claim 9, wherein the third convex and concave pattern includes a polygonal and/or partially curved shape.

\* \* \* \* \*